(12) United States Patent
Song et al.

(10) Patent No.: US 10,797,089 B2
(45) Date of Patent: Oct. 6, 2020

(54) DISPLAY DEVICE HAVING COMPENSATING CAPACITOR AND METHOD OF MANUFACTURING THE SAME

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Yanqin Song, Jiangsu (CN); Siming Hu, Jiangsu (CN); Nan Yang, Jiangsu (CN); Jiuzhan Zhang, Jiangsu (CN)

(73) Assignees: KUNSHAN NEW FLAT PANEL DISPLAY TECHNOLOGY CENTER CO., LTD., Kunshan, Jiangsu (CN); KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 10 days.

(21) Appl. No.: 16/313,619

(22) PCT Filed: Dec. 12, 2017

(86) PCT No.: PCT/CN2017/115604
§ 371 (c)(1),
(2) Date: Dec. 27, 2018

(87) PCT Pub. No.: WO2018/108069
PCT Pub. Date: Jun. 21, 2018

(65) Prior Publication Data
US 2019/0326334 A1    Oct. 24, 2019

(30) Foreign Application Priority Data
Dec. 13, 2016 (CN) .......................... 2016 1 1147363

(51) Int. Cl.
*H01L 27/12* (2006.01)
(52) U.S. Cl.
CPC ........ *H01L 27/1255* (2013.01); *H01L 27/124* (2013.01); *H01L 27/127* (2013.01)
(58) Field of Classification Search
CPC . H01L 27/1255; H01L 27/124; H01L 27/127; H01L 27/12; G09G 3/20;
(Continued)

(56) References Cited

U.S. PATENT DOCUMENTS 8,847,932 B2 * 9/2014 Kang .................. G09G 3/3208
345/204
10,332,938 B2 * 6/2019 Jeong .................. H01L 27/3211
(Continued)

FOREIGN PATENT DOCUMENTS

CN          1628263 A      6/2005
CN        101286515 A     10/2008
(Continued)

*Primary Examiner* — Alexander O Williams
(74) *Attorney, Agent, or Firm* — Muncy, Geissler, Olds & Lowe, P.C.

(57) ABSTRACT

A display device and a method of manufacturing the same are disclosed. The display device includes a substrate (100), and a patterned polysilicon layer, a patterned gate insulating layer and a patterned first conductive layer stacked on the substrate in sequence. The patterned polysilicon layer includes a number of polysilicon blocks (110) doped with impurities. The patterned first conductive layer includes a number of data lines (120) each partially overlapping a corresponding polysilicon block to form a compensating capacitor.

16 Claims, 3 Drawing Sheets

(58) Field of Classification Search
CPC ....... G09G 2300/0426; G09G 2300/08; G09G 2300/0408; G09G 2310/0267
USPC .......................................................... 257/59
See application file for complete search history.

(56) References Cited

U.S. PATENT DOCUMENTS

| | | |
|---|---|---|
| 2005/0231452 A1 | 10/2005 | Tobita |
| 2006/0092342 A1 | 5/2006 | Lee |
| 2008/0251791 A1 | 10/2008 | Yeh et al. |
| 2012/0146004 A1 | 6/2012 | Lee et al. |
| 2014/0022500 A1 | 1/2014 | Watanabe et al. |
| 2015/0255030 A1 | 9/2015 | Watsuda et al. |
| 2016/0329350 A1 | 11/2016 | Na et al. |
| 2017/0062493 A1* | 3/2017 | Jeon .................... H01L 27/1288 |
| 2017/0069271 A1* | 3/2017 | Kim ...................... H01L 27/124 |
| 2017/0179165 A1* | 6/2017 | Lan ..................... H01L 27/1233 |
| 2019/0103060 A1* | 4/2019 | Kang .................... G09G 3/3233 |

FOREIGN PATENT DOCUMENTS

| | | | |
|---|---|---|---|
| CN | 101779227 A | | 7/2010 |
| CN | 102368499 A | | 3/2012 |
| CN | 102569343 A | | 7/2012 |
| CN | 103296030 A | * | 9/2013 |
| CN | 103325688 A | | 9/2013 |
| CN | 103915431 A | | 7/2014 |
| CN | 104064601 A | | 9/2014 |
| CN | 1628263 A | * | 6/2015 |
| CN | 105204248 A | | 12/2015 |
| CN | 105513528 A | | 4/2016 |
| JP | 2002352955 A | | 12/2002 |
| JP | 2005529360 A | | 9/2005 |
| JP | 2010249955 A | | 11/2010 |
| JP | 2014202791 A | | 10/2014 |
| JP | 2015227974 A | | 12/2015 |
| KR | 20030094599 A | | 12/2003 |
| KR | 20060017312 A | | 2/2006 |
| TW | 200307824 A | | 12/2003 |
| WO | WO2008062575 A1 | | 5/2008 |
| WO | WO 2016125640 A1 | | 8/2016 |

* cited by examiner

DISPLAY DEVICE HAVING COMPENSATING CAPACITOR AND METHOD OF MANUFACTURING THE SAME

TECHNICAL FIELD

The present invention relates to the field of display technology and, in particular, to a display device and a method for fabricating the display device.

BACKGROUND

In recent years, the rapid development and increasingly broad application of information technology, wireless mobile communications and information appliances are increasing our dependence on electronic products and have brought about the development of various display technologies and a boom in the field of display devices. Due to the advantages of completely flat, lightweight, slim and power-efficient, the display devices are being widely used.

In the manufacturing of a lower-cost narrow-bezel display device, the gate-in-panel (GIP) technology is often adopted to directly integrate gate drive circuits (i.e., GIP circuits) in a display panel consisting typically of a display area for displaying images and a non-display area surrounding the display area. In the display area, a plurality of scan lines and a plurality of data lines crossing the scan lines are arranged, thus defining an array of pixel cells. The GIP circuits are provided in the non-display area and are connected to the pixel cells via the scan lines.

With the development of display technology, display panels are increasingly diversified in terms of shape. As a result, in addition to the traditional rectangular ones, there are also display panels having different shapes such as polygonal and circular. For example, watches typically use circular display panels. In a rectangular display panel, the number of pixels in each column and in each row is the same. However, it is impossible for a polygonal or circular display panel, as the number of pixels may vary across different columns or rows in such display panels.

Data lines associated with pixel columns containing different numbers of pixels will be inconsistent with one another in terms of parasitic capacitance, which may lead to display unevenness of the display device and necessitates the use of compensating capacitors for parasitic capacitance compensation so as to improve display evenness. However, compensating capacitors employed in conventional display devices have bulky footprints, which hinder the connection between scan lines and GIP circuits and are unfavorable for a narrow bezel.

Therefore, there is an urgent need in the art for a solution to hindered connection between scan lines and GIP circuits in conventional display devices due to excessively large footprints of compensating capacitors used therein.

SUMMARY OF THE INVENTION

It is an object of the present invention to provide a display device and a method for fabricating it, which entail a solution to hindered connection between scan lines and GIP circuits in conventional display devices due to excessively large footprints of compensating capacitors used therein.

To this end, the present invention provides a method for manufacturing a display device, comprising:
providing a substrate;
forming a polysilicon layer on the substrate;
patterning the polysilicon layer to form a plurality of polysilicon blocks;
implanting ions into the plurality of polysilicon blocks;
forming a gate insulating layer over the plurality of polysilicon blocks;
forming a first conductive layer on the gate insulating layer; and
patterning the first conductive layer to form a plurality of data lines each of plurality of data lines partially overlapping a corresponding polysilicon block of the polysilicon blocks so as to form the plurality of compensating capacitors.

Optionally, the method may further comprise, during the patterning the polysilicon layer to form a plurality of polysilicon blocks, patterning the polysilicon layer to form a plurality of first plates of a plurality of pixel capacitors and a plurality of sources and drains of a plurality of thin film transistors.

Optionally, the method may further comprise, during the implanting ions into the plurality of polysilicon blocks, implanting ions into the first plates of the plurality of pixel capacitors.

Optionally, the method may further comprise, during patterning the first conductive layer to form a plurality of data lines, patterning the first conductive layer to form a plurality of second plates of the plurality of pixel capacitors and a plurality of gates of the plurality of thin film transistors.

Optionally, the method may further comprise, subsequent to the patterning the first conductive layer to form a plurality of data lines, forming a second conductive layer over the patterned first conductive layer and patterning the second conductive layer to form a plurality of pixel connection lines and a plurality of power lines.

Optionally, the method may further comprise, prior to the forming a second conductive layer over the patterned first conductive layer and subsequent to the patterning the first conductive layer to form a plurality of data lines, forming a plurality of contact holes in the polysilicon blocks for connecting of the power lines to the polysilicon blocks.

Optionally, in the method, for each of the data lines, an overlapped area of the data line and the polysilicon block may be adjusted based on a number of pixel cells connected to the data line.

Optionally, in the method, the smaller the number of pixel cells connected to the data line is, the greater the overlapped area of the data line and the corresponding polysilicon block may be. Additionally, the greater the number of pixel cells connected to the data line is, the smaller the overlapped area between the data line and the corresponding polysilicon block may be.

In the present invention, there is also provided a corresponding display device, comprising a substrate; and a patterned polysilicon layer, a patterned gate insulating layer and a patterned first conductive layer, stacked on the substrate in sequence, wherein the patterned polysilicon layer comprises a plurality of polysilicon blocks doped with impurities, the patterned first conductive layer comprising a plurality of data lines, each of the plurality of data lines partially overlapping a corresponding polysilicon block of the plurality of polysilicon blocks to form a compensating capacitor.

Optionally, the display device may further comprise a plurality of pixel cells each comprising a thin film transistor and a pixel capacitor, wherein sources and drains of the thin film transistors and first plates of the plurality of pixel capacitors are fabricated in the same process as the polysilicon blocks, and wherein gates of the thin film transistors and second plates of the pixel capacitors are fabricated in the same process as the data lines.

Optionally, the display device may further comprise a plurality of test circuits, wherein each of the data lines has a first end connected to a corresponding pixel cell of the plurality of pixel cells and a second end connected to a corresponding test circuit of the test circuits.

Optionally, the display device may further comprise a plurality of GIP circuits, a plurality of pixel connection lines and a plurality of power lines, the pixel connection lines and the power lines being situated in the same layer and made of the same material, the power lines being connected to the pixel cells and configured to provide pixel cells with a power supply signal, the pixel connection lines being configured to connect the pixel cells to the GIP circuits.

Optionally, in the display device, the compensating capacitor may be provided to compensate for a parasitic capacitance of the data line, and wherein a compensating capacitance of the compensating capacitor is proportional to an overlapped area of the data line and the polysilicon block.

Optionally, in the display device, the overlapped area of the data line and the polysilicon block may be related to a number of the pixel cells connected to the data line.

In summary, in the display device and the method of the present invention, the overlapped area between the doped polysilicon layer and the first conductive layer provides a compensating capacitor for the data line, so that a footprint of the compensating capacitor is reduced and hence the connection between the scan line and GIP circuit is facilitated.

DETAILED DESCRIPTION

The present invention will be described in greater detail below with reference to specific embodiments which are to be read in conjunction with the accompanying drawings. Features and advantages of the invention will be more readily apparent from the following detailed description and from the drawings which are presented in a very simplified form not necessarily presented to scale, with the only intention to facilitate convenience and clarity in explaining the embodiments.

With combined reference to FIGS. 1 to 5, a method for manufacturing a display device according to the present invention includes the steps of:

1) providing a substrate 100;
2) forming a polysilicon layer on the substrate 100;
3) patterning the polysilicon layer to form a plurality of polysilicon blocks 110;
4) implanting ions into the polysilicon blocks 110;
5) forming a gate insulating layer (not shown) over the plurality of polysilicon blocks 110;
6) forming a first conductive layer on the gate insulating layer; and
7) patterning the first conductive layer to form a plurality of data lines 120, the plurality of data lines 120 partially overlapping the polysilicon blocks 110 to provide compensating capacitors.

Figure 1:
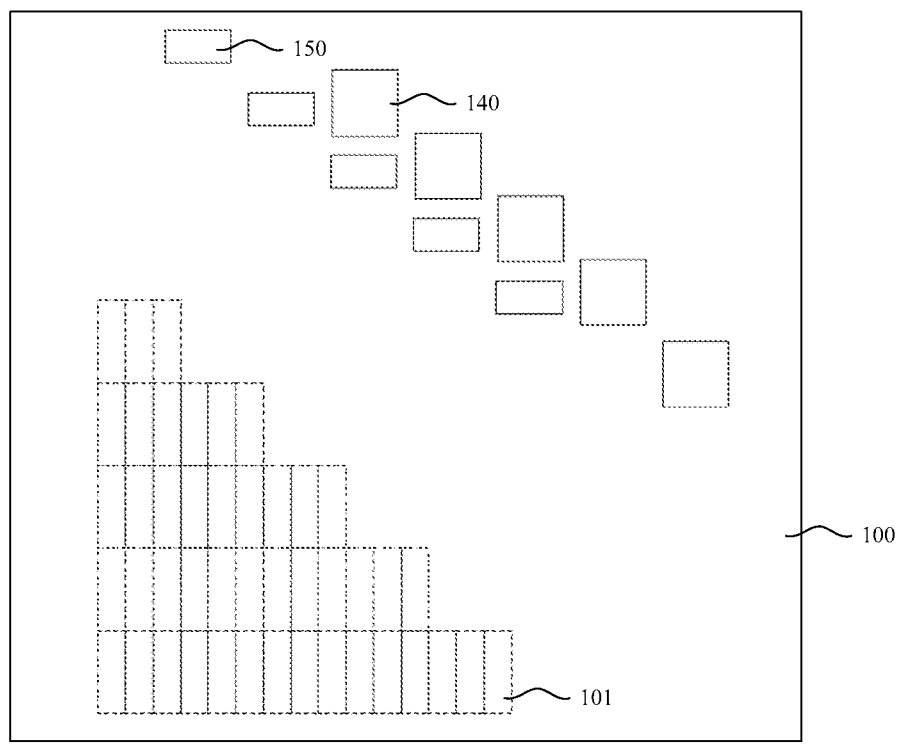
FIG. 1 schematically illustrates a structure resulting from a first step in a method for manufacturing a display device according to an embodiment of the present invention.

Specifically, first of all, as shown in FIG. 1, a substrate 100 is provided. The substrate 100 includes a display area and a non-display area surrounding the display area. The display area is formed with a pixel array including a plurality of pixel cells 101 arranged in a pattern of array. Each pixel cell 101 has a pixel capacitor and a thin film transistor (not shown). The non-display area is formed with a plurality of GIP circuits 140 and test circuits 150.

Figure 2:
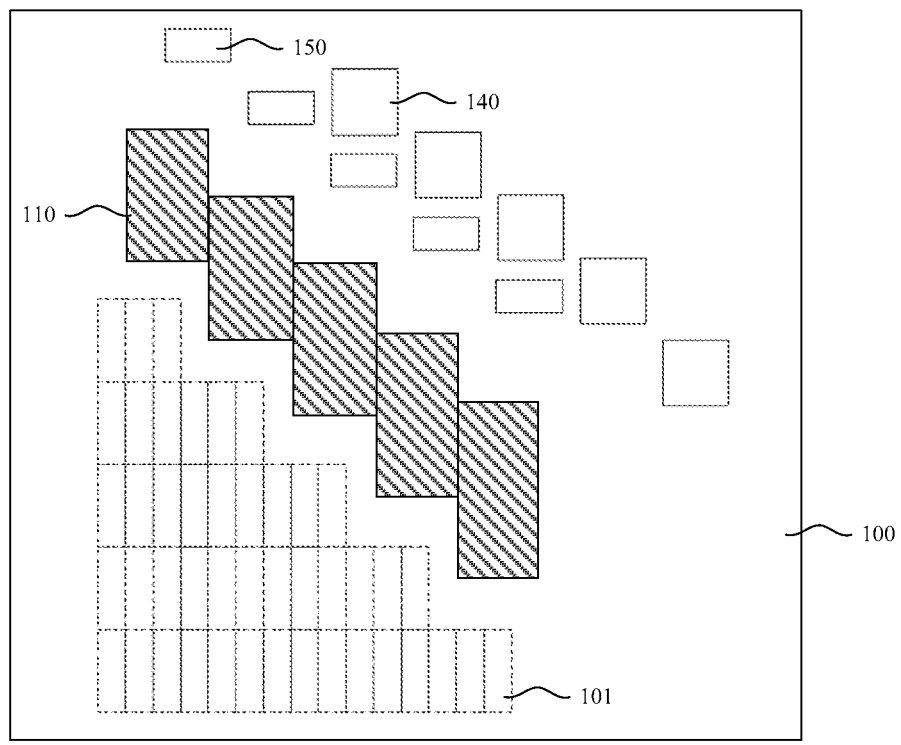
FIG. 2 schematically illustrates a structure resulting from a third step in a method for manufacturing a display device according to an embodiment of the present invention.

Subsequently, as shown in FIG. 2, a polysilicon layer is formed on the substrate 100 and patterned by an etching process to form a plurality of first plates (not shown) of the pixel capacitors in the pixel cells 101, sources and drains (not shown) of the thin film transistors in the pixel cells 101, and a plurality of polysilicon blocks 110 outside the pixel cells 101. In the embodiment illustrated in FIG. 2, the polysilicon blocks 110 are formed between the pixel cells 101 and the test circuits 150. Preferably, the polysilicon blocks 110 are all formed in the non-display area.

Next, boron or phosphorus ions are implanted into the first plates of the pixel capacitors and into the polysilicon blocks 110. The first plate and the polysilicon block 110 are doped by ion implantation, the conductivity of the first plates and polysilicon blocks 110 are improved.

After that, a gate insulating layer is formed over the patterned polysilicon layer and is then patterned.

Figure 3:
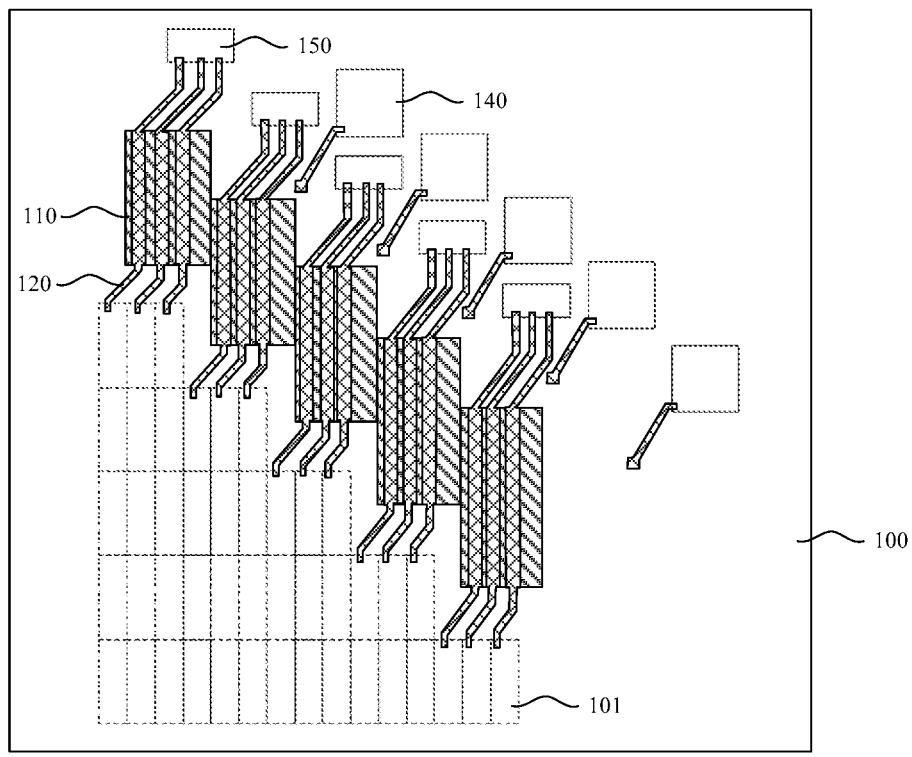
FIG. 3 schematically illustrates a structure resulting from a sixth step in a method for manufacturing a display device according to an embodiment of the present invention.

Thereafter, as shown in FIG. 3, a first conductive layer is formed over the patterned gate insulating layer and is then patterned by an etching process to form second plates (not shown) of the pixel capacitors, gates (not shown) of the thin film transistors and a plurality of data lines 120. Each of the data lines 120 is connected to a corresponding one of the pixel cells 101 at one end and to a corresponding one of the test circuits 150 at the other end. The data lines 120 partially overlap a corresponding one of the polysilicon blocks 110 to provide a compensating capacitor.

The compensating capacitor has a capacitance proportional to an overlapped area of the data line 120 and the polysilicon block 110.

In this embodiment, the overlapped area of the data line 120 and the polysilicon block 110 could be adjusted according to the number of pixel cells 101 in connection with the corresponding data line 120. The fewer pixel cells 101 connected to the data line 120 are, the smaller parasitic capacitance the data line 120 will have, and hence the greater compensating capacitance will be required to be provided by the compensating capacitor, which corresponds to a greater overlapped area of the data line 120 and the polysilicon block 110. On the contrary, the more pixel cells 101 connected to the data line 120 are, the larger a parasitic capacitance the data line 120 will have, and hence the smaller a compensating capacitance will be required to be provided by the compensating capacitor, which corresponds to a smaller overlapped area of the data line 120 and the polysilicon block 110.

During the manufacturing process of the display device, for any of the data lines 120, if it is designed to be connected to a relatively small number of pixel cells 101, then an overlapped area of the data line 120 and a corresponding polysilicon block 110 should be increased. On the contrary, if it is designed to be connected to a relatively large number of pixel cells 101, then an overlapped area between the data line 120 and a corresponding polysilicon block 110 has to be reduced.

Figure 4:
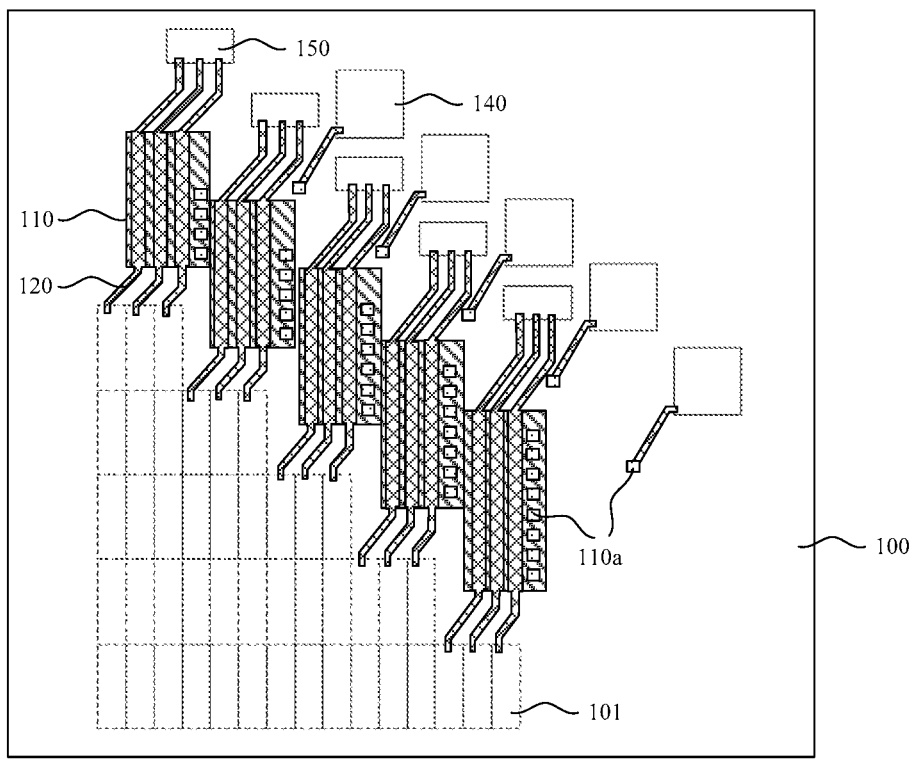
FIG. 4 schematically illustrates a structure resulting from a contact hole fabrication process in a method for manufacturing a display device according to an embodiment of the present invention.

Thereafter, as shown in FIG. 4, a contact hole fabrication process is performed to form a plurality of contact holes 110a in the polysilicon blocks 110. The contact holes 110a terminate within the polysilicon blocks 110, i.e., having a depth smaller than a thickness of the polysilicon blocks 110, so that the polysilicon blocks 110 are exposed at the bottoms of the contact holes 110a.

Figure 5:
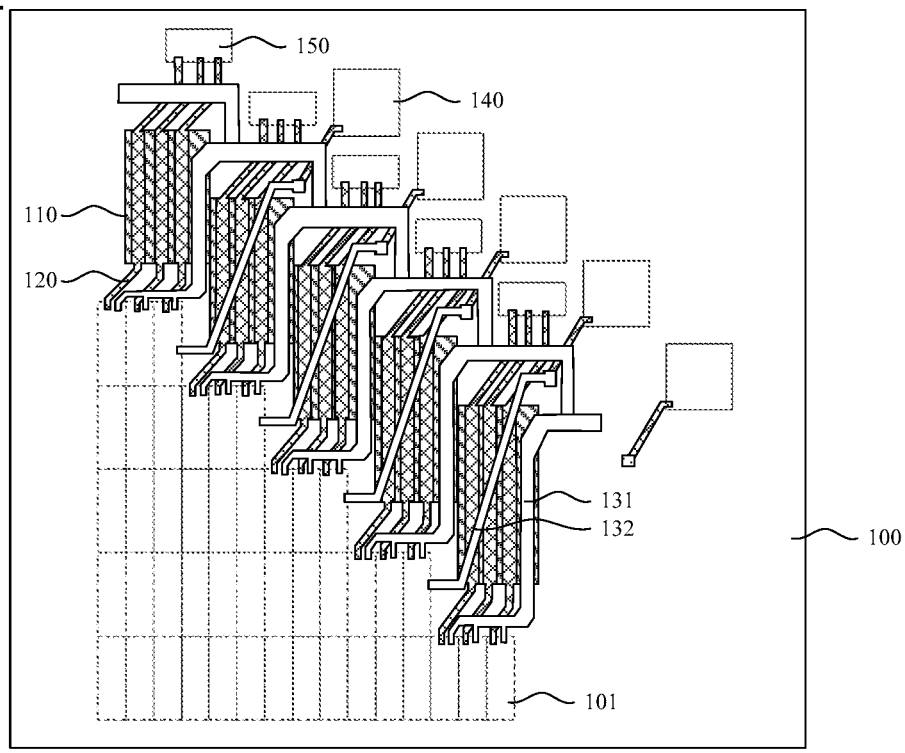
FIG. 5 schematically illustrates a structure resulting from the patterning of a second conductive layer in a method for manufacturing a display device according to an embodiment of the present invention.

Finally, as shown in FIG. 5, a second conductive layer is formed over the patterned first conductive layer and is then patterned by an etching process to form power lines 131 and pixel connection lines 132. The power lines 131 are connected to the polysilicon blocks 110 via the contact holes 110a and the pixel connection lines 132 are configured to connect the pixel cells 101 to the GIP circuits 140.

According to the present invention, the materials of the first conductive layer and the second conductive layer are not limited to any particular materials and may be selected according to practical needs. Examples of the materials from which the first conductive layer and the second conductive layer are fabricated include transparent conductive materials such as indium tin oxide (ITO), indium zinc oxide (IZO), zirconium-doped zinc oxide (ZZO), fluorine-doped tin oxide (FTO), nano silver or the like and non-transparent conductive materials such as silver (Ag), aluminum (Al), tungsten, silver alloys, aluminum alloys or the like.

In the resulting display device 10, each of the compensating capacitors is constructed with one plate provided by the conductive layer and another plate provided by a polysilicon block. In traditional display devices, both of the plates of compensating capacitor are provided by conductive layers.

In the above method, since one plate of the compensating capacitor is provided by a polysilicon block 110, the compensating capacitor has a reduced foot print and can be fabricated more easily. Moreover, the fabrication of the display device can be accomplished by using a two-metal process (involving the formation of two metal layers), dispensing with the need to employ a three-metal process (involving the formation of three metal layers).

In the present invention, a corresponding display device is provided. Further referring to FIG. 5, the display device 10 includes a substrate 100, a patterned polysilicon layer, a patterned gate insulating layer and a patterned first conductive layer stacked on the substrate 100 in sequence. The patterned polysilicon layer includes a plurality of polysilicon blocks 110. The patterned first conductive layer includes a plurality of data lines 120 each having a part overlapping a corresponding one of the polysilicon blocks 110 to form a compensating capacitor.

Specifically, the display device 10 also includes a plurality of scan lines (not shown) for providing scan signals and a plurality of data lines 120 for providing data signals. The scan lines cross the data lines 120 to form a plurality of pixel cells 101 each arranged in an array. Each of pixel cells 101 includes a pixel capacitor (not shown) and a thin film transistor (not shown). Second plates of the pixel capacitors and gates of the thin film transistors, together with data lines 120 (all located in the first conductive layer), are manufactured in the same process. First plates of the pixel capacitors and sources and drains of the thin film transistors and the polysilicon blocks 110 (all located in the polysilicon layer) are fabricated in the same process.

With continued reference to FIG. 5, the patterned polysilicon layer and the patterned first conductive layer are partially overlapped (i.e., the data lines 120 partially overlapping with a corresponding one of the polysilicon blocks 110). The overlapped area of the polysilicon layer and the first conductive layer provides the opposing plates of the compensating capacitors, with the gate insulating layer between the polysilicon layer and the first conductive layer acting as the insulating dielectric of the compensating capacitor.

In this embodiment, the compensating capacitance is provided to compensate for parasitic capacitances of the data lines 120. The compensating capacitance of each of the compensating capacitors is proportional to an overlapped area of a corresponding one of the data lines 120 and a corresponding one of the polysilicon blocks 110. The overlapped area of the data line 120 and the polysilicon block 110 is related to the number of pixel cells 101 in connection with the data line 120. The more pixel cells 101 connected to the data line 120 are, the smaller overlapped area of the data line 120 and the polysilicon block 110 is, and hence the compensating capacitance the compensating capacitor provides is smaller. On the contrary, fewer pixel cells 101 connected to the data line 120, the greater the overlapped area of the data line 120 and the polysilicon block 110 is, and therefore the compensating capacitance provided by the compensating capacitor would be greater.

A data signal supplied to the pixel cells 101 from the data line 120 is also applied to one plate of the compensating capacitor, to compensate a parasitic capacitance compensation of the data line 120. Since the compensating capacitances provided by the compensating capacitors depend on the numbers of pixel cells 101 connected to the data lines 120, the parasitic capacitance compensation for the data lines 120 could be effectively achieved even if the number of pixel cells in different columns is different. Thus, display unevenness could be always avoided.

In conjunction with FIGS. 4 and 5, the display device 10 further includes a plurality of power lines 131 connected at one end to the pixel cells 101 so as to provide the pixel cells with a power supply signal. Additionally, a plurality of contact holes 110a are provided in the polysilicon blocks 110. The power lines 131 are connected to the polysilicon blocks 110 via the contact holes 110a.

Further referring to FIG. 5, the display device 10 further includes a plurality of pixel connection lines 132 and GIP circuits 140. The pixel connection lines 132 connect the pixel cells 101 to the GIP circuits 140. In this embodiment, the pixel connection lines 132 and the power lines 131 are fabricated (both in the second conductive layer) in the same process.

Further referring to FIG. 5, the display device 10 further includes test circuits 150. The data lines 120 are connected at one end to the pixel cells 101 and to the test circuits 150 at the other end. The test circuits 150 provide test signals for determining whether the display device 10 displays images normally.

The display device in this embodiment could be a liquid crystal display (LCD) device, a plasma display panel (PDP), a vacuum fluorescent display (VFD) device, an organic light-emitting display (OLED) device, a flexible display device or a display device of another type, and the present application is not limited to any particular type of the display device.

In summary, in the display device and the method of the present invention, the overlapped area between the doped polysilicon layer and the first conductive layer provides a compensating capacitor for the data line, so that the footprint of the compensating capacitor is reduced and hence the connection between the scan line and GIP circuit is facilitated.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. A display device, comprising a plurality of pixel cells, wherein the display device comprises:
   a substrate; and
   a patterned polysilicon layer, a patterned gate insulating layer and a patterned first conductive layer, stacked on the substrate in sequence, the patterned polysilicon layer comprising a plurality of polysilicon blocks which are arranged outside the pixel cells and doped with impurities, the patterned first conductive layer comprising a plurality of data lines, each of the plurality of data lines partially overlapping a corresponding polysilicon block of the plurality of polysilicon blocks to form a compensating capacitor to compensate for a parasitic capacitance of the data line which is related to a number of the pixel cells connected to the data line.

2. The display device of claim 1, each of the plurality of pixel cells comprising a thin film transistor and a pixel capacitor, the patterned polysilicon layer further comprises a plurality of sources and drains of the thin film transistors of the plurality of pixel cells and a plurality of first plates of the pixel capacitors of the plurality of pixel cells, and the patterned first conductive layer further comprises gates of the thin film transistors of the plurality of pixel cells and a plurality of second plates of the pixel capacitors of the plurality of pixel cells.

3. The display device of claim 2, further comprising a plurality of test circuits, wherein each of the data lines has a first end connected to a corresponding pixel cell of the plurality of pixel cells and a second end connected to a corresponding test circuit of the plurality of test circuits.

4. The display device of claim 2, further comprising a plurality of GIP circuits, a plurality of pixel connection lines and a plurality of power lines, the plurality of pixel connection lines and power lines being situated in a same layer and made of a same material, the plurality of power lines being connected to the plurality of pixel cells to provide the plurality of pixel cells with a power supply signal, the plurality of pixel connection lines connecting the plurality of pixel cells to the plurality of GIP circuits.

5. The display device of claim 1, wherein the compensating capacitor is provided to compensate for a parasitic capacitance of the data line, and a compensating capacitance of the compensating capacitor is proportional to an overlapped area of the data line and the polysilicon block.

6. The display device of claim 5, wherein the overlapped area of the data line and the polysilicon block is related to a number of the pixel cells connected to the data line.

7. A method for manufacturing a display device comprising a plurality of pixel cells, comprising:
   providing a substrate;
   forming a polysilicon layer on the substrate;
   patterning the polysilicon layer to form a plurality of polysilicon blocks outside the pixel cells;
   implanting ions into the plurality of polysilicon blocks;
   forming a gate insulating layer over the plurality of polysilicon blocks;
   forming a first conductive layer on the gate insulating layer; and
   patterning the first conductive layer to form a plurality of data lines, each of plurality of data lines partially overlapping a corresponding polysilicon block of the polysilicon blocks to form a compensating capacitor to compensate for a parasitic capacitance of the data line which is related to a number of the pixel cells connected to the data line.

8. The method for manufacturing a display device of claim 7, further comprising, during the patterning the polysilicon layer to form a plurality of polysilicon blocks, patterning the polysilicon layer to form a plurality of first plates of a plurality of pixel capacitors and a plurality of sources and drains of a plurality of thin film transistors.

9. The method for manufacturing a display device of claim 8, further comprising, during the implanting ions into the plurality of polysilicon blocks, implanting ions into the first plates of the plurality of pixel capacitors.

10. The method for manufacturing a display device of claim 8, further comprising, during patterning the first conductive layer to form a plurality of data lines, patterning the first conductive layer to form a plurality of second plates of the plurality of pixel capacitors and a plurality of gates of the plurality of thin film transistors.

11. The method for manufacturing a display device of claim 7, further comprising, subsequent to the patterning the first conductive layer to form a plurality of data lines, forming a second conductive layer over the patterned first conductive layer and patterning the second conductive layer to form a plurality of pixel connection lines and a plurality of power lines.

12. The method for manufacturing a display device of claim 11, further comprising, prior to the forming a second conductive layer over the patterned first conductive layer and subsequent to the patterning the first conductive layer to form the plurality of data lines, forming a plurality of contact holes in the polysilicon blocks for connecting the power lines to the polysilicon blocks.

13. The method for manufacturing a display device of claim 7, wherein an overlapped area of the data line and the polysilicon block is determined by a number of pixel cells connected to the data line.

14. The method for manufacturing a display device of claim 13, wherein the overlapped area of the data line and the polysilicon block is inversely related to the number of pixel cells connected to the data line.

15. The display device of claim 1, wherein the plurality of pixel cells are arranged in an array having a step shape.

16. The method for manufacturing a display device of claim 7, wherein the plurality of pixel cells are arranged in an array having a step shape.

* * * * *